Jan. 18, 1966 A. E. MARTENS 3,230,469

PHOTO-ELECTRIC BIAS CONTROL CIRCUIT

Filed Jan. 2, 1962

INVENTOR.
ALEXANDER E. MARTENS
BY Arthur L. Nelson
Frank C. Parker
ATTORNEYS

United States Patent Office 3,230,469 Patented Jan. 18, 1966

3,230,469

PHOTO-ELECTRIC BIAS CONTROL CIRCUIT

Alexander E. Martens, Greece, N.Y., assignor to Bausch & Lomb Incorporated, Rochester, N.Y., a corporation of New York Filed Jan. 2, 1962, Ser. No. 163,457
5 Claims. (Cl. 330—59)

This invention relates to a signal control circuit and more particularly to a bias control and signal attenuating means in an amplifier stage.

In an electrical circuit including a signal source and an amplifier stage, it is often desirable to provide a means of controlling the amplitude of the output signal, or turn the signal "on" and "off," in such manner as not to add any appreciable amount of distortion or noise due to switching transients, and not to affect the signal source in a way which would tend to change the quality of incoming signal. In an audiometer, for example, it is necessary to interrupt or to turn on an audio signal without introduction of noise or audible transients into the test tone. It is also desirable to keep the tone generator (oscillator) operating to avoid transient changes in amplitude and waveform, which would normally occur if oscillation were interrupted. Certain rise and decay time for the signal must be maintained to satisfy recognized requirement for audiometers.

Accordingly, this control circuit is connected to the control grid of an amplifier tube and has a means of varying the bias on the tube. Simultaneously, with the variation in the bias of the tube, a shunting circuit operates to reduce the signal amplitude and thereby preventing the clipping of the signal. The audible switching transients ordinarily present during the make and break of a switching circuit are eliminated through the use of a photoemissive device in the grid bias circuit of the amplifier and a suitably controlled light source.

It is an object of this invention to eliminate audible switching transients from the output of an amplifier stage during signal interruption by use of a bias circuit incorporating a photoemissive device.

It is another object of this invention to eliminate audible switching transients from the output signal by controlling the rise and decay of the signal amplitude through variation of the bias voltage in a grid control circuit.

It is a further object of this invention to interrupt the transmission of a signal by applying a negative bias to the control grid in an amplifier stage and simultaneously decreasing the amplitude of the signal through the use of a photoemissive device and a light source.

The objects of this invention are accomplished by the use of a controlled amplifier stage. A plurality of resistors are connected between a negative potential and grid of the amplifier tube which includes at least one photoemissive device. A coupling capacitor connects the signal source to the grid and a capacitive means which provides a charging and discharging time constant, is connected intermediate the resistive elements in the bias circuit. The photoemissive device which is connected between resistive elements is also connected to the grid and is controlled in response to an incandescent lamp in a light circuit. The light circuit includes a switch and a resistor in series with the lamp. The resistor provides the desired rise and decay time for the light circuit and the switch controls the on-off condition for the light. The photoemissive device operates in response to impinging light from the lamp. As the photoemissive device is illuminated it decreases its resistance and allows a higher negative bias to appear on the grid of the amplifier stage. The timing of the rise and decay of the negative bias is determined by the time constant C.R., as well as by the illumination time constant due to resistor 31 in series with the lamp. As the resistance of the photoemissive device decreases with increasing light intensity a reduction of the amplitude of the input signal takes place due to the voltage dividing action of resistor 3, the photoemissive device and the capacitor 4 and 24. Therefore, the negative instantaneous voltage excursion is prevented to exceed the current cut-off bias of the amplifier tube and a signal clipping is thus avoided.

Switch transients due to arcing are eliminated as no switch is present in the grid circuit per se. The desired time constant may be varied by a suitable resistor in the light circuit and C.R. time constant.

The following figures illustrate the preferred version of the bias control circuit. Various modifications of the circuit might be devised which may fall within the spirit of the invention of which the preferred version is illustrated in the following figures.

Figures 1, 2, 3, 4:
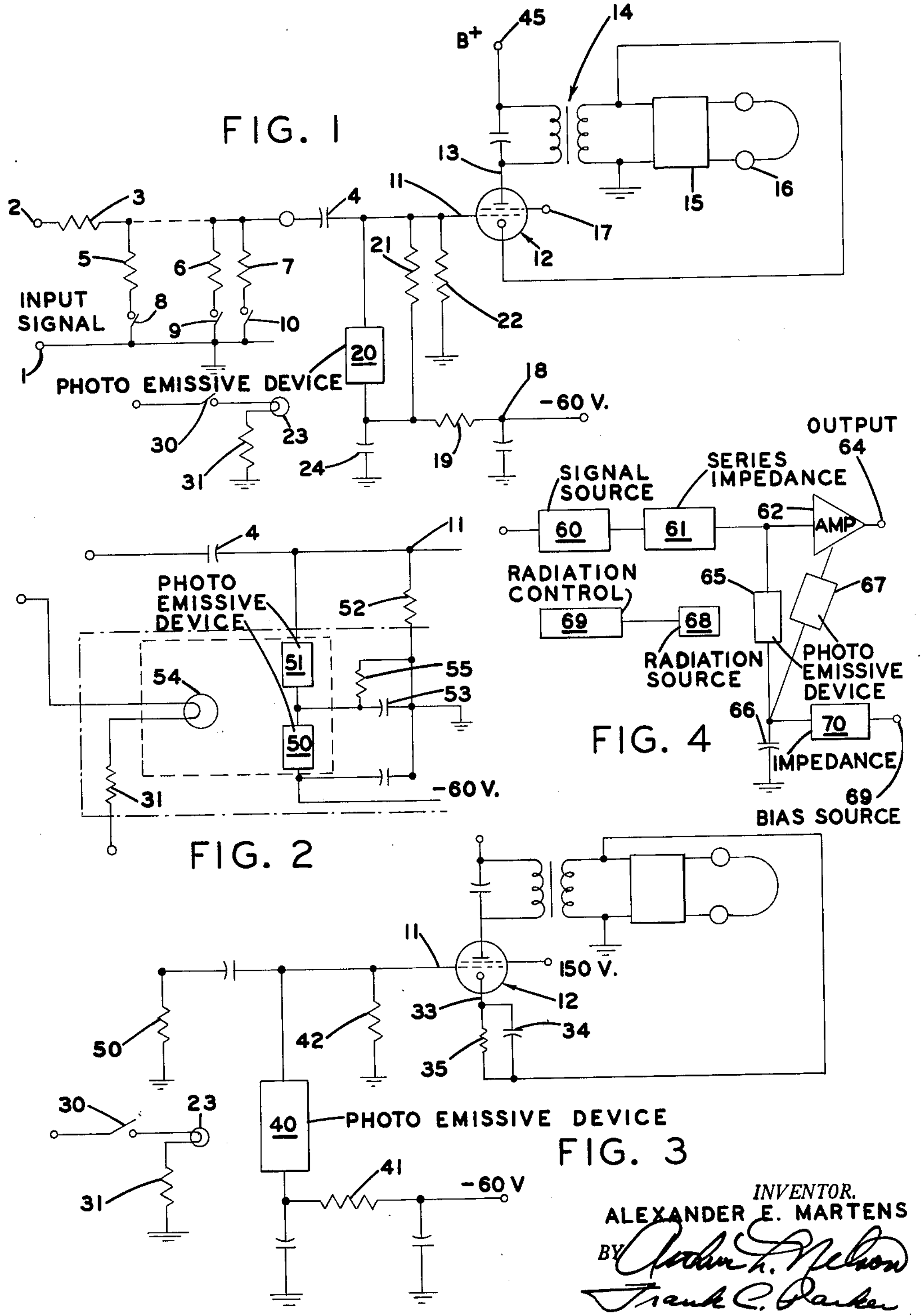
FIG. 1 is a circuit diagram of the bias circuit.
FIG. 2 is a modification of the circuit using two photoemissive elements.
FIG. 3 is a modification of FIG. 1 including a self bias circuit in place of a fixed bias for linear tube operation in a conductive state.
FIG. 4 is a schematic diagram of the bias control and signal shunting circuit.

Referring to FIG. 1 an input signal is impressed across the terminals 1 and 2. A resistor 3 is connected in series with terminal 2 and the coupling capacitor 4. A weighting circuit comprising a plurality of resistors 5, 6 and 7 is connected intermediate the resistor 3 and the coupling capacitor 4. Each of the resistors 5, 6 and 7 are connected through a switch 8, 9 and 10 respectively to ground. The weighting circuit may comprise any number of resistors and is not limited to three as illustrated. The signal impressed on terminals 1 and 2 may be audio signal or have a frequency higher than audio signal. For the purpose of illustration, it is assumed that an audio signal is impressed on terminals 1 and 2.

The coupling capacitor 4 transmits the signal to the grid 11 of the tube 12. The plate 13 of tube 12 is connected to an output transformer 14 and an attenuator 15 or may be connected to the following stage. The attenuator in turn is connected to the earphone 16 as illustrated or any suitable output means.

The screen grid 17 is connected to a 150 volt potential.

The amplifier stage including the tube 12 has a fixed bias which is controlled by the high negative voltage applied on terminal 18. The negative potential on terminal 18 is connected through the resistor 19 to the photoemissive device 20 and resistor 21 which are connected in parallel. The opposite end of the photoemissive device and resistor 21 are connected to the grid 11 of tube 12. A grid resistor 22 is connected between ground and grid 11 of tube 12. The plurality of resistors 19, 21 and 22 provide a bias voltage of the grid 11 on tube 12 during normal operation. The photoemissive device 20 provides a very high resistance when the lamp is dark. The capacitors 24 and 25 charge up to their respective voltages determined by the voltage divider 19, 21 and 22 and maintain a relatively constant voltage, during normal operation of the tube.

The photoemissive device 20 is controlled through the lamp 23. As the switch 30 is closed the lamp 23 is energized. The time constant of the light circuit is controlled by the resistor 31. As the switch 30 is closed the photoemissive device 20 is illuminated by lamp 23 and its resistance decreases thereby placing a high negative bias on the grid 11 of tube 12 and cutting off the output signal.

FIG. 3 illustrates a modification of FIG. 1 whereby a self biasing circuit is connected to the cathode 33. A self-biasing circuit includes the capacitor 34 and resistor 35. The lighting circuit is the same as illustrated in FIG. 1. A single resistor 50 in the weighting circuit is indicated although the circuit is more completely shown in FIG. 1. The photoemissive device 40 illustrated in FIG. 2 is placed in series with the resistors 41 and 42. The circuit operates in response to illumination of the photoemissive element 40, its resistance is reduced thereby placing a high negative potential on the grid 11 of tube 12 and cutting off the output signal.

The bias circuit illustrated in FIG. 2 uses a self biasing cathode circuit, and an output circuit of the same design illustrated in FIGS. 1 and 3. The circuit in FIG. 2 also uses the same lighting circuit as illustrated in FIGS. 1 and 3. The variation in the circuit consists in the use of two photoemissive devices 50 and 51 in series with the grid resistor 52. The capacitor 53 charges to a high negative potential upon illumination of the lamp 54 in the lighting circuit, due to the photoconduction of photoemissive device 50. The rate of this charge is determined by the capacitor 53, and lamp 54 and resistor 31. The rising negative bias is impressed on the grid 11 of tube 12 through the photoemissive device 51 at the rate determined by capacitor 4, resistor 52, and the time constant of the lighting circuit. This in turn cuts off the tube 12. The signal transmitted through the coupling capacitor 4 is partially shunted through the photoemissive device 51 and capacitor 53 to ground.

When the lamp 54 is dark the capacitor 53 discharges through the discharging resistor 55 to ground. The discharge is controlled by the resistance in resistor 55 and the capacitance in capacitor 53. The rate of decay of the signal amplitude is controlled *only* by the time constant of the lighting circuit and is independent of the bias control.

The advantage of this circuit over the previously described is in allowing different rates of negative voltage rise and signal amplitude decrease. This makes a selection of optimum switching conditions for least distortion possible.

FIG. 4 illustrates a schematic diagram of the biasing and shunting circuit. A signal source 60 provides a signal for transmission through the series impedance 61 to the amplifier 62. The amplifier amplifies the signal and the signal is transmitted to the output terminal 64. Two photoemissive devices are included in the schematic diagram. The photoemissive device 65 when conducting, shunts a signal through the capacitor 66 to ground. The second photoemissive device 67 controls D.C. variations controlling the operation of the amplifier. The photoemissive devices 65 and 67 operate in response to radiation from the radiation source 68 which is controlled by the control means 69. The control means 69 might be a pulsing circuit, a variable control, or switching device for controlling radiation from the source. The radiation from radiation source 68 impinges the photoemissive devices 65 and 67 controlling the bias for the amplifier 62 and shunting of the input signal to ground. The amplifier 62 might be controlled by a single or a plurality of control elements to provide the desired control for signal transmission.

The bias for the amplifier is provided through the bias source 69 connected to the impedance 70 and the photoemissive devices to the amplifier 62.

The circuit illustrated in FIG. 1 operates in the following manner. The B+ voltage is connected to the terminal 45. The bias on the grid circuit is controlled in FIG. 1 by the negative potential of 60 volts connected to terminal 18. Through the conduction of the resistors 22, 21 and 19 and also the photoemissive 20 parallel to resistor 21 a bias of approximately 6 volts is placed on the tube. This is a normal bias for the tube during operation.

For interruption of signal transmission through the amplier stage the switch 30 is closed. The closing of switch 30 turns on the lamp 23. The light from the lamp 23 impinges upon the photoemissive device 20. The impinging of the light on the photoemissive device 20 reduces the resistance of the device causing a shunting a major portion of the bias current around the resistor 21 through the photoemissive device. This in turn places a greater negative potential on the grid 11 of the tube 12. The tube reaches a point of cutoff preventing transmission of signal through the amplifier stage.

Simultaneously, with the decrease in the resistance of the photoemissive device 20 the signal passing through the coupling capacitor 4 is partially shunted through the photoemissive device 20 and capacitor 24 to ground. This greatly reduces the amplitude of the signal on the grid 11 of tube 12, due to action of the voltage divider consisting of resistor 3, capacitor 4, photoemissive device 20, and capacitor 24. With the signal being substantially reduced as the bias moves to a cutoff point, no audible clipping of signal, or switching transients pass through the tube. This provides a means of cutting off the tube without any detectable noises.

The circuit illustrated in FIG. 3 operates in substantially the same manner, the differences being in that the cathode has a self-biasing circuit and the photoemissive device carries all the current in the grid biasing circuit.

The bias circuits as illustrated and described are the preferred embodiment of this invention and is claimed in the attached claims.

What is claimed is:

1. A signal control means comprising a capacitive coupling circuit connected intermediate a signal source and an amplifier stage including, a voltage divider connected between a suitable negative potential and a neutral potential, means connecting an intermediate point on said voltage divider directly to the control element of said amplifier stage for applying the bias voltage on the amplifier stage, a photoemissive device connected across a portion of a resistance in said voltage divider with one end connected directly to the control element operating as a shunting impedance in the voltage divider, capacitive means connected to the other end of said photoemissive device and to a neutral potential, a source of light having control means for illuminating said light and directing light on said photoemissive device to reduce the impedance of said device and shunt the signal from said coupling circuit through said capacitive means to ground and simultaneously increase the negative bias on said amplifier stage to thereby cut off the amplifier stage.

2. A signal control means comprising, a coupling circuit connected intermediate a signal source and an amplifier including, a plurality of impedance elements serially connected between a negative voltage and a neutral potential, a photoemissive device connected in parallel with one of said impedance elements with an end connected directly to a control element of said amplifier, a junction connecting two of said impedance elements directly connected to the control element of the amplifier for applying a bias potential on the control element of the amplifier stage, a capacitive means connecting the other end of said photoemissive device to a neutral potential, a second photoemissive device directly connected to a second control element of said amplifier and said other end of said first photoemissive device, a light source having energizing means directing radiation on said photoemissive devices to attenuate the signal in said coupling circuit and reduce the total resistance across the voltage divider and thereby place a negative cutoff voltage on the control elements of said amplifier.

3. A signal control means comprising, a coupling circuit connected intermediate a signal source and an amplifier stage, a voltage divider including a plurality of impedance elements connected between a high negative potential and ground, a photoemissive device connected in parallel with one of said impedance elements and also having one end directly connected to the control element of the amplifier stage and with the other end of said device connected through a capacitive means to ground, an illuminating circuit having a predetermined time constant comprising a non-linear resistance light and a resistive component serially connected to an operating means directing illumination on the photoemissive device when lit to thereby reduce the impedance of said photoemissive device and shunt the signal from said coupling circuit through said capacitive means to ground and simultaneously place a high negative bias on the control element on the amplifier stage and cut off amplification in said amplifier stage.

4. A signal control means comprising a coupling circuit connected intermediate the signal source and a control element of an amplifier including, a voltage divider including a plurality of impedance elements serially connected between a suitable negative potential and a neutral potential, one of said impedance elements being a photoemissive device connected on one end directly to the control element of said amplifier, a capacitor connected to the other end of said photoemissive device and to a neutral potential, an illuminating circuit including a non-linear resistance light source serially connected with a resistor to a suitable potential and actuated through a switching means to provide the desired time constant of illumination of said light, said light source directing light on said photoemissive device reducing the impedance of said device to attenuate the signal from said coupling circuit and shunt the signal through said capacitor to ground while simultaneously decreasing the overall resistance of said voltage divider to impress a high negative potential on the control element of said amplifier thereby cutting off the operation of the amplifier.

5. A signal control means comprising a coupling circuit connected intermediate a signal source and an amplifier including a voltage divider circuit including a plurality of photoemissive devices and a resistance serially connected intermediate a suitable negative potential and a neutral potential, a junction of one of said photoemissive devices and said resistance directly connected to the control element of said amplifier applying a bias potential on the control element of said amplifier, a capacitor connecting a junction of two of said photoemissive devices to ground, a lamp serially connected to a resistive element across a suitable potential through a switching means providing a light directed on said photoemissive devices reducing the resistance of said photoemissive devices for attenuation of the signal from said coupling circuit and shunting said signal to the neutral potential while simultaneously reducing the overall resistance of the voltage divider to apply a cutoff potential on the amplifier.

References Cited by the Examiner

UNITED STATES PATENTS

| | | | |
|---|---|---|---|
| 1,597,683 | 8/1926 | Herbig | 330—59 X |
| 1,631,213 | 6/1927 | Latour | 330—59 |
| 2,810,097 | 10/1957 | Rabinow | 317—130 X |

FOREIGN PATENTS

| | | |
|---|---|---|
| 585,419 | 2/1947 | Great Britain. |

ROY LAKE, *Primary Examiner.*

NATHAN KAUFMAN, *Examiner.*